(12) United States Patent
Khoueir et al.

(10) Patent No.: US 8,193,089 B2
(45) Date of Patent: Jun. 5, 2012

(54) CONDUCTIVE VIA PLUG FORMATION

(75) Inventors: Antoine Khoueir, Apple Valley, MN (US); Yongchul Ahn, Eagan, MN (US); Peter Nicholas Manos, Eden Prairie, MN (US); Shuiyan Huang, Apple Valley, MN (US); Ivan Petrov Ivanov, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 155 days.

(21) Appl. No.: 12/502,220

(22) Filed: Jul. 13, 2009

(65) Prior Publication Data

US 2011/0006436 A1 Jan. 13, 2011

(51) Int. Cl.
*H01L 21/4763* (2006.01)
(52) U.S. Cl. ................... 438/643; 257/E21.584
(58) Field of Classification Search ............ 438/643; 257/E21.584
See application file for complete search history.

(56) References Cited

U.S. PATENT DOCUMENTS

| 5,719,416 | A  | * | 2/1998  | Yoshimori et al. ........... 257/295 |
|-----------|----|---|---------|-------------------------------------|
| 6,455,419 | B1 |   | 9/2002  | Konecni et al.                      |
| 6,858,511 | B1 |   | 2/2005  | Marathe                             |
| 7,144,490 | B2 |   | 12/2006 | Cheng et al.                        |
| 7,176,128 | B2 |   | 2/2007  | Ahrens et al.                       |
| 7,199,019 | B2 |   | 4/2007  | Park et al.                         |
| 7,224,068 | B2 |   | 5/2007  | Tseng et al.                        |
| 2003/0054628 | A1 | * | 3/2003 | Leng et al. ................... 438/622 |
| 2003/0127043 | A1 | * | 7/2003 | Lu et al. ........................ 117/95 |
| 2004/0203228 | A1 |   | 10/2004 | Liao et al.                        |
| 2005/0118796 | A1 | * | 6/2005 | Chiras et al. ................. 438/618 |
| 2007/0066060 | A1 | * | 3/2007 | Wang ............................. 438/685 |
| 2008/0003796 | A1 | * | 1/2008 | Jeong et al. .................... 438/597 |
| 2008/0254617 | A1 | * | 10/2008 | Adetutu et al. ............... 438/643 |

* cited by examiner

*Primary Examiner* — Lex Malsawma
(74) *Attorney, Agent, or Firm* — Hall Estill Attorneys at Law

(57) ABSTRACT

Various embodiments of the present invention are generally directed to a method of forming a conductive via plug in a semiconductor device. A first and second metal layer are electrically connected by a via plug that is formed by depositing a tungsten seed layer on a plurality of metal barrier layers within a recess using atomic layer deposition. The recess is then filled with tungsten using chemical vapor deposition.

20 Claims, 5 Drawing Sheets

CONDUCTIVE VIA PLUG FORMATION

BACKGROUND

Semiconductor devices generally operate to process data signals. Efficient operation often necessitates a close proximity of electrical components in a semiconductor device to maximize space and reduce signal path lengths. As a consequence, vertical construction of electrical components such as microchips and microprocessors has been developed to allow three dimensional optimization of space in a semiconductor device.

As semiconductor devices have increased in speed and power, the number and complexity of electrical components therein have also increased. As such, it has been found increasingly difficult to achieve the requisite electrical isolation and/or electrical interconnection of the respective electrical components in a device.

SUMMARY

Various embodiments of the present invention are generally directed to a method for forming a conductive via plug in a semiconductor device.

In accordance with some embodiments, a first and second metal layer are electrically connected by a via plug that is formed by depositing a tungsten seed layer on a plurality of metal barrier layers within a recess using atomic layer deposition. The recess is filled with tungsten using chemical vapor deposition.

In accordance with other embodiments, a plurality of metal barrier layers that separate a first metal layer from a conductive via plug are formed by depositing a first metal barrier layer within a recess of a dielectric layer. The first metal barrier layer is etched before successively applying a second metal barrier layer of titanium and a third metal barrier layer of titanium nitride.

In accordance with other embodiments, a plurality of metal barrier layers are formed that separate a first metal layer from a conductive via plug by depositing a first metal barrier layer within a recess of a dielectric layer. The first metal barrier layer is etched before successively applying a second metal barrier layer of titanium and a third metal barrier layer of titanium nitride.

These and other features and advantages which characterize the various embodiments of the present invention can be understood in view of the following detailed discussion and the accompanying drawings.

DETAILED DESCRIPTION

Figure 1:
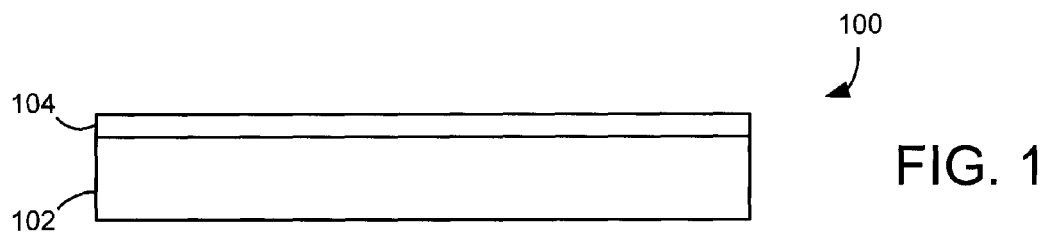
FIG. 1 is an exemplary semiconductor device constructed in accordance with various embodiments of the present invention.

FIG. 1 provides an exemplary semiconductor device 100 constructed in accordance with various embodiments of the present invention. A first metal layer 102 is shown adjacent to a dielectric layer 104. The first metal layer 102 can be a variety of metals including, but not limited to, copper and aluminum. In some embodiments, the first metal layer 102 is patterned, etched, filled, and polished to predetermined dimensions based on the design of the semiconductor device. The dielectric layer 104 also can be constructed in various configurations on and around the first metal layer 102. One such configuration can be the encasement of the first metal layer 102 by the dielectric 104.

In addition, the dielectric layer 104 can be configured to comprise numerous different dielectric materials that partially or completely surround the first metal layer 102. For example, the first metal layer 102 can be constructed of copper and encased by the dielectric layer 104 that comprises silicon nitride, silicon oxy-nitride and other dielectric films that can serve as barrier against Cu out-diffusion.

Figure 2:
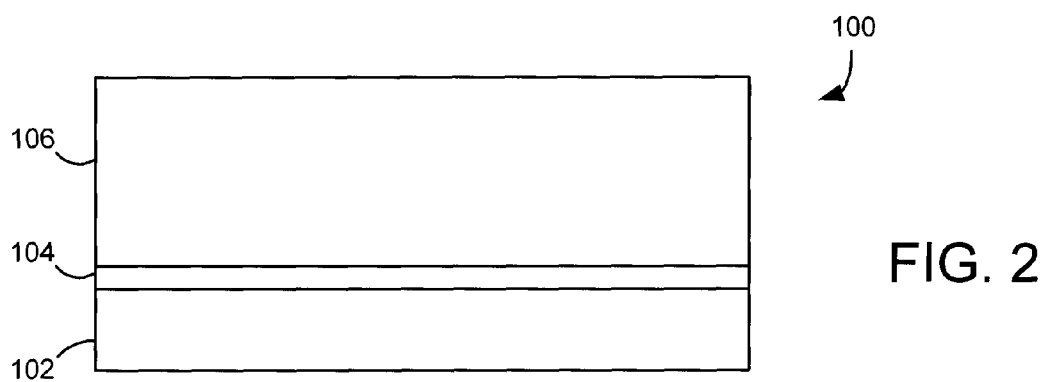
FIG. 2 shows the semiconductor device of FIG. 1 further constructed in accordance with various embodiments of the present invention.

In FIG. 2, an oxide is deposited and forms a dielectric layer 106 on the dielectric layer 104 to further construct the semiconductor device 100. While the oxide layer 106 can be comprised of various dielectric materials, an undoped silicon dioxide is used in some embodiments. That is, compounds such as fluorinated silica glass and phosphorus silica glass that are doped may provide less advantageous operation than the use of undoped silicon dioxide. The oxide layer 106 is shown in contacting engagement with the dielectric layer 104. However, it should be noted that the size and orientation of the oxide layer 106 can be any desired configuration that electrically isolates the first metal layer 102.

Figure 3:
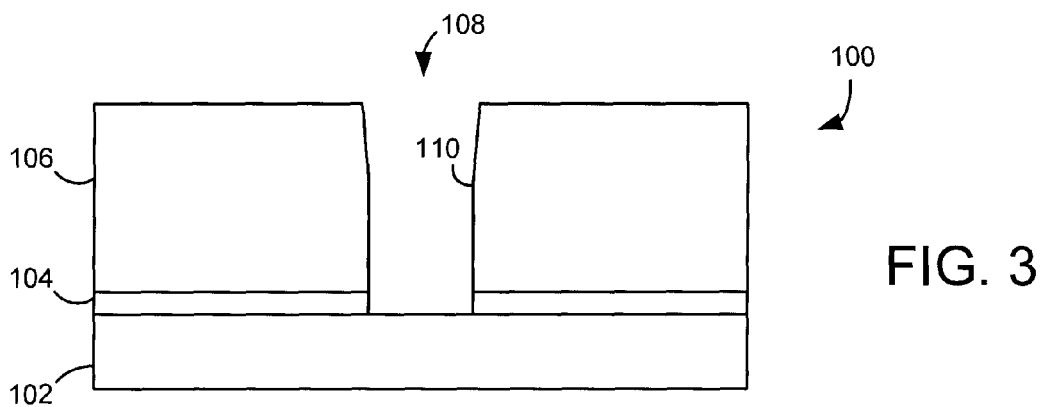
FIG. 3 illustrates the semiconductor device of FIG. 2 further constructed in accordance with various embodiments of the present invention.

A further exemplary construction of the semiconductor device 100 of FIG. 2 is displayed in FIG. 3. The dielectric layer 106 is etched to produce a via defined by a recess 108. The recess 108 features a sidewall 110 that is substantially vertical and penetrates through both the dielectric layer 106 as well as the dielectric layer 104. In some embodiments, separate etching procedures are utilized to completely define the recess 108. It should be noted that the recess 108 is not limited in size or orientation. That is, the sidewall 110 can be various configurations that produce a variety of recess volumes while not deterring from the spirit of the present invention.

The creation of via in the recess 108 to vertically connect the first metal layer 102 with another metal layer can have several practical difficulties. During both manufacturing and operation, changes in moisture and temperature can render a via useless by degrading various physical and electrical characteristics. As such, a via plug in the recess 108 that exhibits a resistance to both moisture and metal migration can be operationally beneficial.

Figure 4:
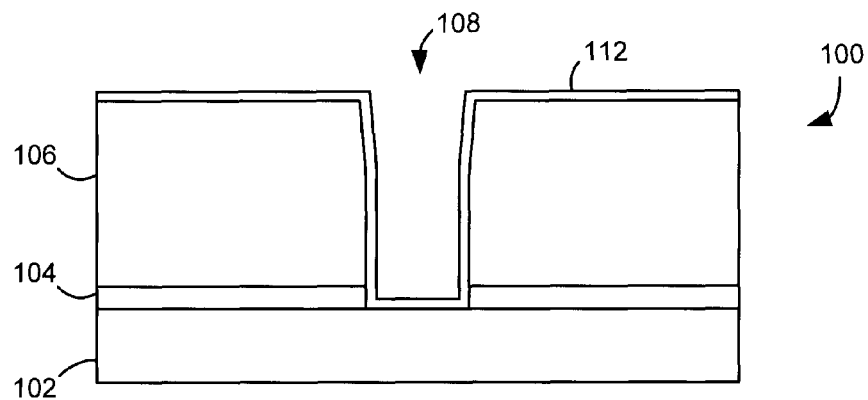
FIG. 4 provides the semiconductor device of FIG. 3 further constructed in accordance with various embodiments of the present invention.

FIG. 4 illustrates the semiconductor device 100 of FIG. 3 further constructed in accordance with various embodiments of the present invention. Any native copper oxide present at the bottom of the recess 108 can be removed with physical sputter and chemical reduction alone or in combination, but is not required to form a tungsten conductive via plug in accordance with the present invention. Regardless, a first metal barrier layer is deposited adjacent to the dielectric layer 106 as well as throughout the recess 108.

The first metal barrier layer 112 provides a moisture barrier for the otherwise exposed vias. In some embodiments, the first metal barrier layer 112 comprises a tantalum nitride compound, but various other materials can be used as desired.

Figure 5:
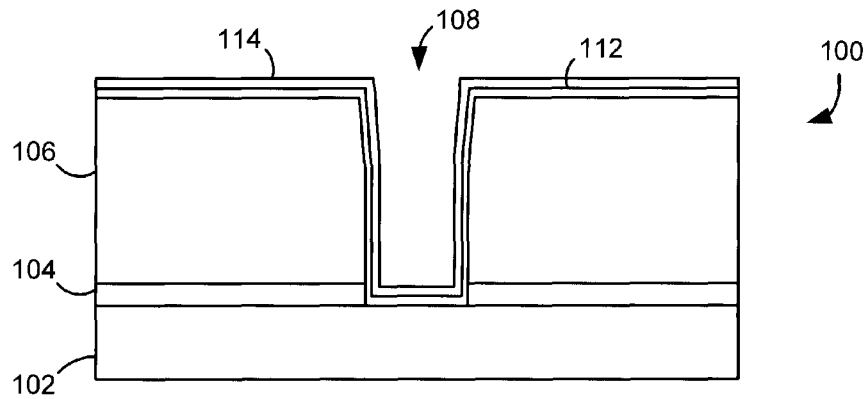
FIG. 5 displays the semiconductor device of FIG. 4 further constructed in accordance with various embodiments of the present invention.

The semiconductor device 100 of FIG. 4 is further constructed in FIG. 5 by removing any native oxide from the first metal barrier layer 112 with an etching process. Afterward, a second metal barrier layer 114 is applied in a contactingly adjacent position to the first metal barrier layer 112. In some embodiments, a pure titanium metal is used to form the second metal barrier layer 114, but the use of titanium is not limiting as other pure metals such as aluminum can similarly be deposited. A practical advantage to using pure titanium is the added reduction of residual native oxide present on the first metal barrier layer 112.

Figure 6:
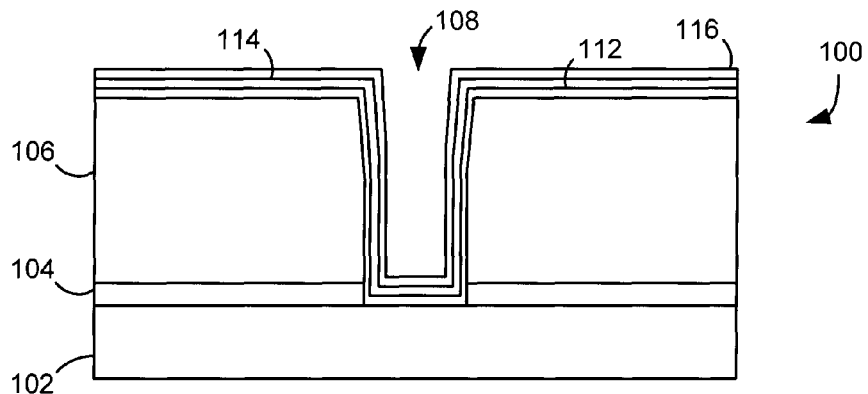
FIG. 6 generally features the semiconductor device of FIG. 5 further constructed in accordance with various embodiments of the present invention.

Further in some embodiments, the second metal barrier layer 114 is applied with a physical vapor deposition. Likewise, a third metal barrier layer 116 can be formed on the second metal barrier layer 114 with physical vapor deposition, shown in FIG. 6. Meanwhile, the third metal barrier layer 116 can be constructed with various materials including, but not limited to, ceramic coatings such as titanium nitride and titanium aluminum nitride. It should be noted that the physical vapor deposition of either the second or third metal barrier layers can be replaced by a chemical vapor deposition without deterring from the spirit of the present invention.

It can be appreciated that the first, second, and third metal barrier layers 112, 114, and 116 are formed along and around the recess 108 to effectively seal the via from contamination from moisture and unwanted particles. As a result, the via is less susceptible to voids and imperfections, once filled, that can occur when contaminants enter a via and change its physical and electrical characteristics over time.

Figure 7:
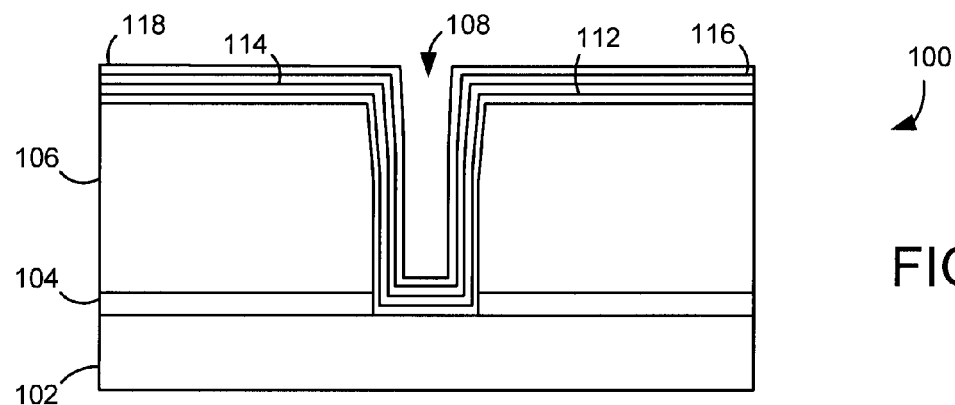
FIG. 7 shows the semiconductor device of FIG. 6 further constructed in accordance with various embodiments of the present invention.

With a series of three metal barrier layers in place to seal the recess 108, a seed layer 118 of tungsten is formed in contacting abutment to the third metal barrier layer 116, as illustrated in FIG. 7. An exemplary embodiment of the present invention forms the seed layer 118 with atomic layer deposition. However, various other layer application processes can be utilized to deposit tungsten throughout the recess 108.

The presence of the seed layer 118 enables a tungsten plug to be formed in the recess 108 with a greatly reduced chance of voiding. Likewise, the seed layer 118 provides a path to future shrinking of the vias in more advanced technologies. It should be noted that the seed layer 118 is fully conformal to the tungsten desired to fill the recess so that a single tungsten conductive via plug can be formed, as opposed to two dissimilar tungsten layers.

Figure 8:
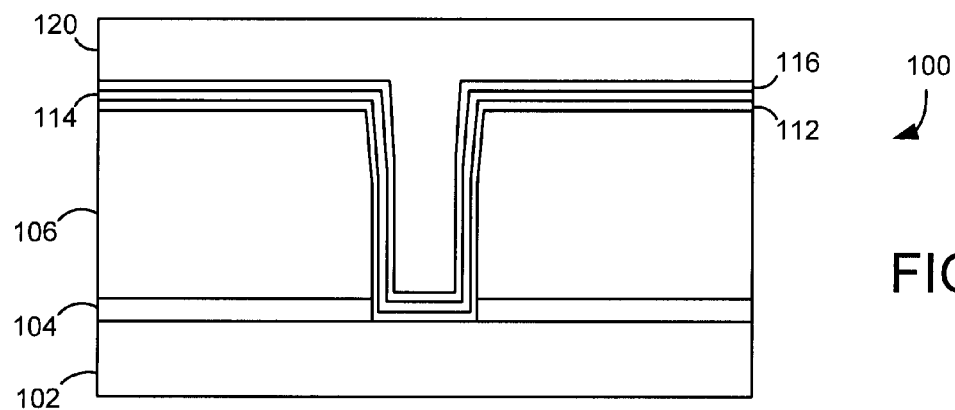
FIG. 8 shows the semiconductor device of FIG. 7 further constructed in accordance with various embodiments of the present invention.

FIG. 8 shows the semiconductor device 100 of FIG. 7 further constructed with a tungsten layer 120 applied to the seed layer 118 to form a tungsten conductive via plug. The seed layer 118 and newly deposited tungsten conform into a single layer of tungsten that is capable of electrically connecting the first metal layer 102 with another conductive material. As shown, the tungsten layer 120 is applied, in some embodiments, along the length of the dielectric layer 106 in combination with filling the recess to a plane external to the dielectric layer 106.

Deposition of the tungsten layer 120 can be facilitated with various processes including, but not limited to, chemical vapor deposition, pulse nucleation layer deposition, and atomic layer deposition. Furthermore, the deposition of the tungsten layer 120 can be configured to be various sizes and orientations, but a layer of at least one and one half times the size of the recess 108 is deposited in some embodiments.

Figure 9:
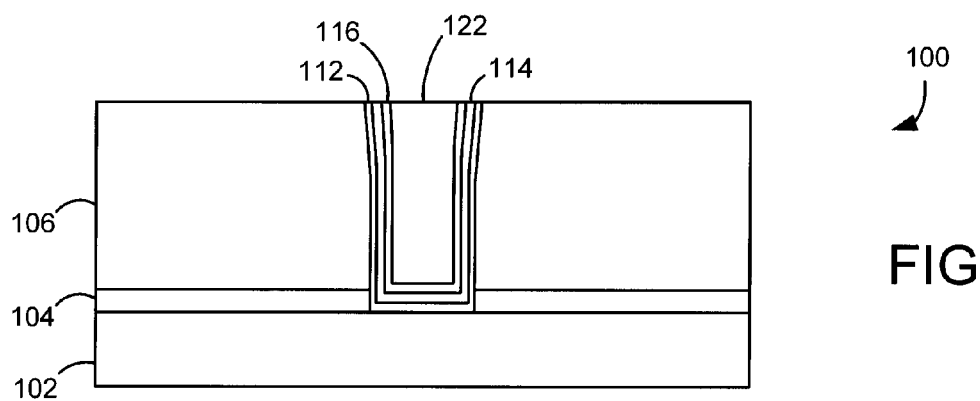
FIG. 9 displays the semiconductor device of FIG. 8 further constructed in accordance with various embodiments of the present invention.

In FIG. 9, the semiconductor device 100 of FIG. 8 is further constructed. A removal of the metal barrier layers and tungsten external to the recess 108 is performed. The removal can be facilitated with a variety of processes, but is conducted with a chemical mechanical polishing is some embodiments. As a result, the recess is filled with a plurality of metal barrier layers and a tungsten conductive via plug 122. The extent of the plug 122 and metal barrier layers is limited to the recess without presence on the horizontal plane of the oxide layer 106. As such, the plug 122 is sealed and has an improved resistance to moisture and metal migration.

Figure 10:
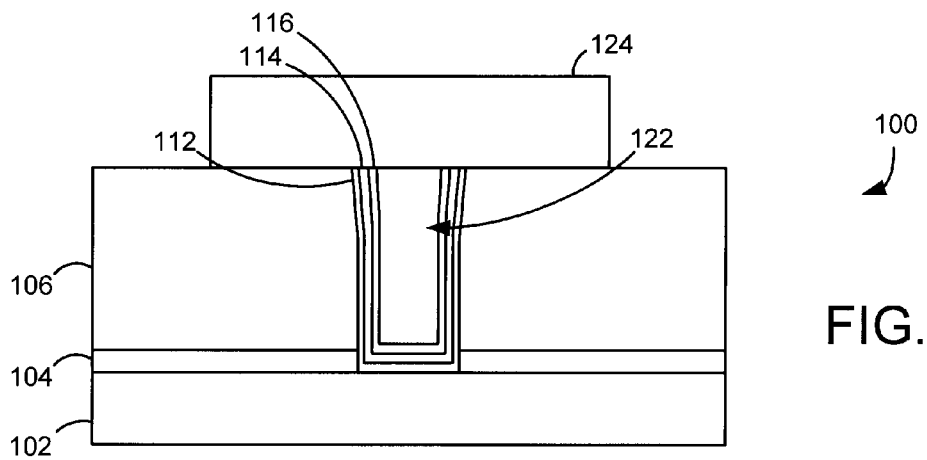
FIG. 10 illustrates the semiconductor device of FIG. 9 further constructed in accordance with various embodiments of the present invention.

FIG. 10 continues construction of the semiconductor device 100 of FIG. 9 by installing a second metal layer 124 in contacting abutment to the via plug 122. The second metal layer 124 can be applied with any desired process, but is formed with physical vapor deposition in some embodiments. It is anticipated that the second metal layer 124 could be a combination of materials and films such as, but not limited to, titanium nitride and titanium tungsten. Likewise, a variety of metals can be utilized to provide an electrical conduit including aluminum, copper, tungsten, and titanium nitride.

In the case of either tungsten or copper is used as the second metal layer 124, a damascene process flow, either single or dual, can be utilized to produce conductive lines in electrical connection with the first metal layer 102. It can be appreciated that with the second metal layer 124 in place, additional vias can be created and filled to produce other electrical connections. Such connections can be on any number of substrates and include various numbers of electrical components.

Figure 11A:
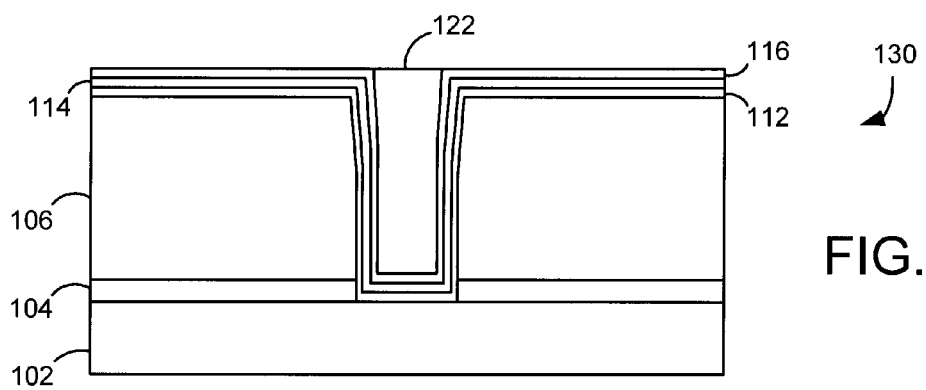
FIG. 11A and 11B provide the semiconductor device of FIG. 8 constructed in accordance with various alternative embodiments of the present invention.
Figure 11B:
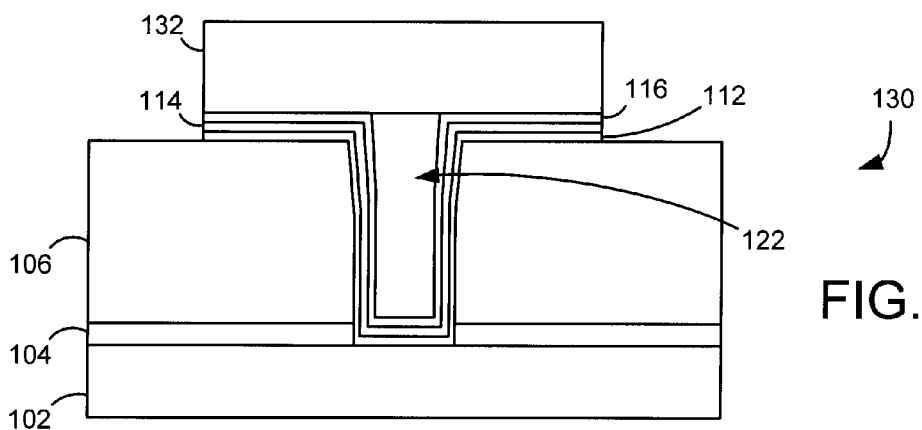

In an alternative embodiment shown in FIGS. 11A and 11B, the semiconductor device 100 of FIG. 8 is further constructed by removing only the tungsten external to the recess 108. As a result, the first, second, and third metal barrier layers extend past the recess, as displayed in FIG. 11A. Meanwhile, the tungsten conductive via plug 122 is filled and sealed by the plurality of metal barrier layers.

Next, a second metal layer 132 is applied in contacting abutment to the via plug 122 to enable an electrical connection from the first metal layer 102. As shown in FIG. 11B, the metal barrier layers can be disposed between the dielectric layer 106 and the second metal layer 132. Furthermore, the metal barrier layer material external to the second metal layer 132 can be removed either before or after the deposition of the second metal layer 132.

However, it should be noted that the alternative embodiment shown in FIGS. 11A and 11B is not limiting. That is, the tungsten layer 120 as well as the second and third metal barrier layers 114 and 116 can be removed to leave the via plug 122 sealed with only the first metal barrier layer 112. Likewise, two of the three metal barrier layers could remain to seal the via. The advantageous effect of the alternative embodiments shown in FIGS. 11A and 11B ensure that the edges of the via plug 122 are not exposed. As such, the opportunity for oxide cultivation, metal migration, and moisture penetration are all greatly reduced.

While any conductive material can comprise the first and second metal layers 102 and 124, in some embodiments copper occupies the first metal layer 102 while either aluminum or titanium nitride makes up the second metal layer 124. Further in some embodiments, the first metal layer 102 is positioned along a horizontal plane that resides below a horizontal plane occupied by the second metal layer 124 or 132.

Figure 12:
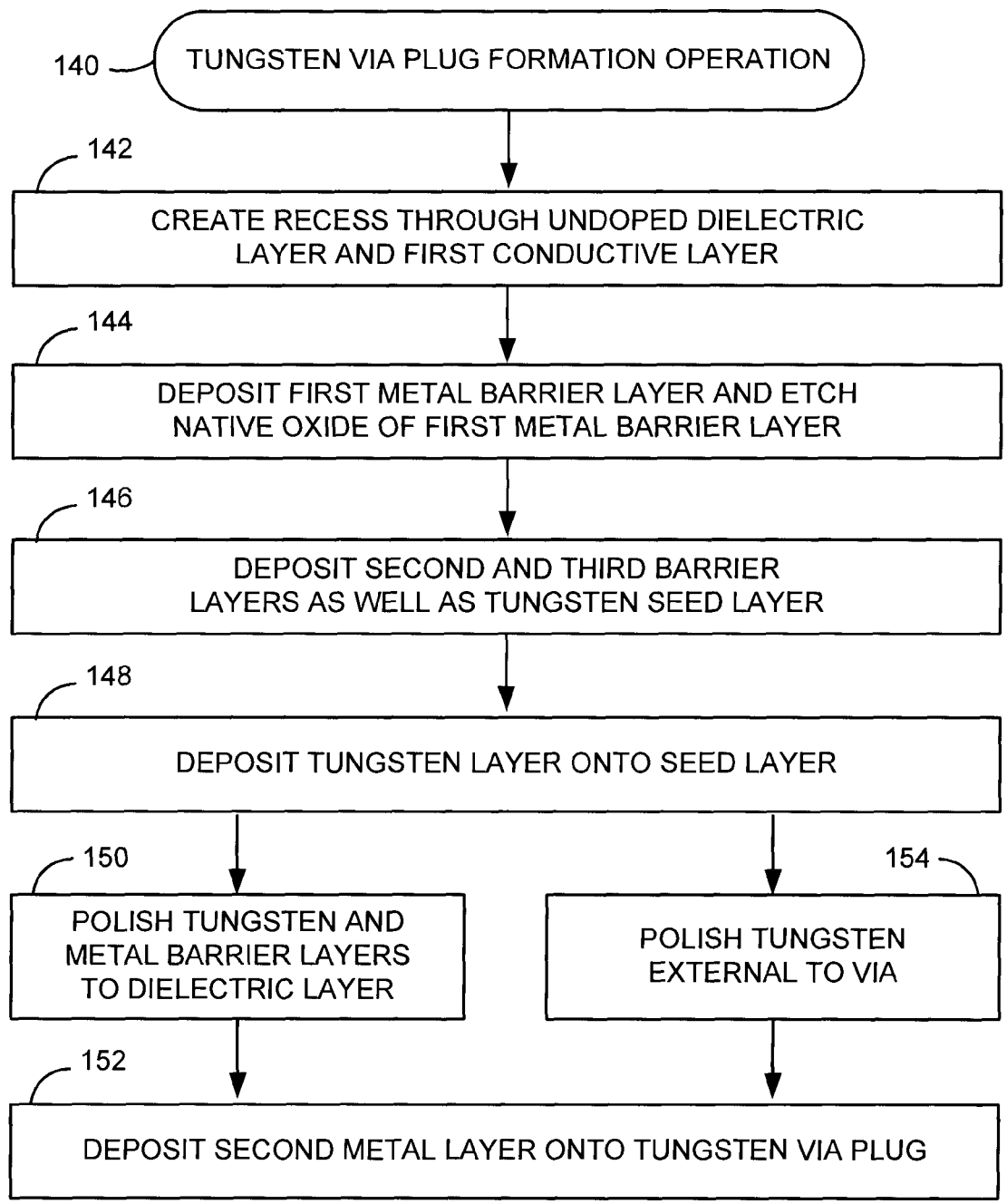
FIG. 12 shows a flow chart of a tungsten via plug formation operation carried out in accordance with various embodiments of the present invention.

In FIG. 12, a flow chart of an exemplary tungsten via plug formation operation 140 is shown as performed in accordance with various embodiments of the present invention. The operation 140 initially creates a recess through an undoped dielectric layer and first conductive layer to the first metal layer in step 142. The recess is coated with a first metal barrier layer that is etched to remove any native oxide in step 144. In step 146, the second and third metal barrier layers are deposited onto the etched first metal barrier layer in succession.

In some embodiments, the dielectric layer comprises silicon dioxide while the first metal barrier layer comprises tantalum nitride, the second metal barrier layer comprises pure titanium, and the third metal barrier layer comprises titanium nitride. A tungsten seed layer is then applied to the third metal barrier layer in step 146 that conforms to the metallurgy of the tungsten layer deposited in step 148. The tungsten and metal barrier material is then removed in step 150 to the dielectric layer by a chemical mechanical polishing.

As a result, a single tungsten conductive via plug is formed that is annularly sealed by the plurality of metal barrier layers to prevent unwanted metal migration and moisture penetration of the via plug. Finally at step 152, a second metal layer is deposited onto the tungsten via plug to create an electrical connection from the first metal layer to the second metal layer.

In the alternative, step 150 can be replaced by a polishing of only the tungsten external to the via in step 154. While the via plug extends beyond the access, the plurality of metal barriers maintains an annual seal about the plug. Thus, the depositing of the second metal layer onto the tungsten via plug in step 152 does not have an increased opportunity for contamination, moisture penetration, and metal migration.

It will now be appreciated that the various embodiments presented herein provide various advantages over the prior art. The use of these successive steps in the formation of a tungsten via plug can result in significant reductions in errors and improvement in reliability.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising forming a conductive via plug that electrically connects first and second metal layers in a semiconductor device by forming a tungsten seed layer on a plurality of metal barrier layers within a recess, each metal barrier layer sealing the recess and extending external to the recess, filling the recess with tungsten, and then removing less than all the metal barrier layers external to the recess to seal the recess with a single metal barrier layer.

2. The method of claim 1, wherein chemical mechanical polishing removes tungsten and the metal barrier layers external to the recess.

3. The method of claim 2, wherein the second metal layer is deposited onto the tungsten conductive via plug after the chemical mechanical polishing.

4. The method of claim 1, wherein the tungsten conductive via plug is disposed between the first metal layer and the second metal layer.

5. The method of claim 1, wherein the first metal layer comprises copper and the second metal layer comprises aluminum.

6. The method of claim 1, wherein the first metal layer comprises copper and the second metal layer comprises copper.

7. The method of claim 6, wherein the second metal layer is deposited using a damascene process.

8. The method of claim 1, wherein one of the metal barrier layers and the second metal layer comprise titanium nitride.

9. The method of claim 1, wherein the conductive via plug is formed by atomic layer deposition of the tungsten seed layer followed by filling the recess with tungsten through a pulse nucleation layer process.

10. The method of claim 1, wherein the conductive via plug is formed solely with atomic layer deposition.

11. The method of claim 1, wherein the conductive via plug is formed solely by a pulse nucleation layer process.

12. The method of claim 1, wherein the conductive via plug is formed solely with chemical vapor deposition.

13. A semiconductor device having a conductive via plug formed in accordance with the method of claim 1.

14. A method comprising forming a plurality of metal barrier layers that separate a first metal layer from a conductive via plug by depositing a first metal barrier layer within a recess of a dielectric layer, etching the first metal barrier layer before successively applying a second metal barrier layer of titanium and a third metal barrier layer of titanium nitride, each metal barrier layer extending beyond the recess, and removing portions of the second and third metal barrier layers external to the recess to seal an external edge of the recess with the first metal barrier layer while sealing bottom and side internal surfaces of the recess with the first, second, and third metal barrier layers.

15. The method of claim 14, wherein the dielectric layer comprises an undoped silicon dioxide.

16. The method of claim 14, wherein the first metal barrier layer comprises tantalum nitride.

17. The method of claim 14, wherein the titanium nitride is applied adjacent to the titanium metal barrier layer with chemical vapor deposition.

18. The method of claim 14, wherein the recess of the dielectric layer extends to the first metal layer so that the metal barrier layers contactingly engage the first metal layer.

19. The method of claim 14, wherein the conductive via plug comprises tungsten and a second metal layer is deposited on the conductive via plug after tungsten external to the recess is removed with a chemical mechanical polishing.

20. A method comprising forming a conductive via plug by applying a tungsten seed layer that electrically connects a first and second metal layer using atomic layer deposition onto a plurality of metal barrier layers within a recess, filling the recess with tungsten using chemical vapor deposition, wherein the plurality of metal barrier layers that separate the first metal layer from the tungsten conductive via plug are formed external to the recess by depositing a first metal barrier layer within a recess of a dielectric layer, and etching the first metal barrier layer before successively applying a second metal barrier layer of titanium and a third metal barrier layer of titanium nitride, removing the first and second and third metal barrier layers external to the recess while sealing internal surfaces of the recess with the first, second and third metal barrier layers, depositing the second metal layer directly onto the conductive via plug, and etching the first metal barrier layer external to the recess to conform with a dimension of the second metal layer.

* * * * *